United States Patent
Chen et al.

(10) Patent No.: US 7,365,978 B2
(45) Date of Patent: Apr. 29, 2008

(54) HEAT DISSIPATING DEVICE

(75) Inventors: Chun-Chi Chen, Tu-Cheng (TW);
Shi-Wen Zhou, Shenzhen (CN); Meng Fu, Shenzhen (CN); Chi Liang, Shenzhen (CN)

(73) Assignees: Fu Zhun Precision Industry (Shenzhen) Co., Ltd., Bao'an District, Shenzhen City, Guangdong Province (CN); Foxcomm Technology Co., Ltd., Tu-Cheng City, Taipei Hsien (TW)

( * ) Notice: Subject to any disclaimer, the term of this patent is extended or adjusted under 35 U.S.C. 154(b) by 185 days.

(21) Appl. No.: 11/135,593

(22) Filed: May 23, 2005

(65) Prior Publication Data

US 2006/0104036 A1   May 18, 2006

(30) Foreign Application Priority Data

Dec. 11, 2004   (CN)   ............ 2004 2 0102795 U

(51) Int. Cl.
*H05K 7/20*   (2006.01)
(52) U.S. Cl. ...................... 361/697; 174/15.2
(58) Field of Classification Search ........... 361/699, 361/697, 695, 700; 174/15.1, 15.2, 16.1, 174/16.3; 257/714, 715; 165/80.4, 104.26, 165/104.23
See application file for complete search history.

(56) References Cited

U.S. PATENT DOCUMENTS

| | | | | |
|---|---|---|---|---|
| 5,699,853 | A | 12/1997 | Goth et al. ............ | 165/104.21 |
| 6,394,175 | B1 | 5/2002 | Chen et al. ............. | 165/80.3 |
| 6,915,844 | B2 * | 7/2005 | Chou .................... | 165/104.33 |
| 7,021,368 | B2 * | 4/2006 | Lin et al. ............... | 165/104.33 |
| 7,110,259 | B2 * | 9/2006 | Lee et al. ................ | 361/700 |

FOREIGN PATENT DOCUMENTS

| | | |
|---|---|---|
| CN | 091111959 | 8/2003 |
| CN | 091212183 | 8/2003 |

* cited by examiner

*Primary Examiner*—Tulsidas C. Patel
(74) *Attorney, Agent, or Firm*—Morris Manning Martin LLP; Tim Tingkang Xia, Esq.

(57) ABSTRACT

A heat dissipating device includes a heat sink (60), a radiator (70) and heat-transfer pipes (80). The heat sink includes a chassis (62), a plate (64) separate from the chassis and a plurality of fins (66) extending between the chassis and the plate. The radiator includes a base (72) parallel to the fins. Each heat-transfer pipe includes a heat-absorbing portion (82) thermally positioned to the chassis, a heat-releasing portion (84) thermally positioned to the plate and a heat-transfer portion (86) disposed between the heat-absorbing portion and the heat-releasing portion. The heat-transfer portion is thermally received in the base of the radiator.

18 Claims, 3 Drawing Sheets

HEAT DISSIPATING DEVICE

BACKGROUND

1. Field

The present invention relates to a heat dissipating device incorporating with heat-transfer pipes, and more particularly to a heat dissipating device for removing heat from an electronic component.

2. Prior Art

During operation of an electronic component such as a computer central processing unit (CPU), a large amount of heat is often produced. The heat must be quickly removed from the CPU to prevent it from becoming unstable or being damaged. Typically, a heat sink is attached to an outer surface of the CPU to absorb heat from the CPU. The heat absorbed by the heat sink is then dissipated to ambient air.

Conventionally, a heat sink comprises a solid metal base attached on the CPU, and a plurality of fins formed from the base. The base is intimately attached on the CPU, and must be adequately cooled to ensure normal operation of the CPU. Most of the heat accumulated at the base is transferred firstly to the fins and then dissipated from the fins. However, the electronics technology continues to advance, and increasing amounts of heat are being generated by powerful state-of-the-art CPUs. Many conventional heat sinks are no longer able to efficiently remove heat from these CPUs.

An improved heat dissipation device is desired to overcome the above-described disadvantages of the prior art.

SUMMARY

Accordingly, what is needed is a heat dissipating device which achieves a great heat-transfer capability and a great heat dissipation capability.

A heat dissipating device in accordance with a preferred embodiment of the present invention comprises a heat sink, a radiator and heat-transfer pipes. The heat sink comprises a chassis, a plate separate from the chassis and a plurality of fins extending between the chassis and the plate. The radiator comprises a base parallel to the fins. Each heat-transfer pipe comprises a heat-absorbing portion thermally positioned to the chassis, a heat-releasing portion thermally positioned to the plate and a heat-transfer portion disposed between the heat-absorbing portion and the heat-releasing portion. The heat-transfer portion is thermally received in the base of the radiator.

Other advantages and novel features of the present invention will become more apparent from the following detailed description when taken in conjunction with the accompanying drawings, in which:

DETAILED DESCRIPTION OF THE EMBODIMENT

Figure 1:
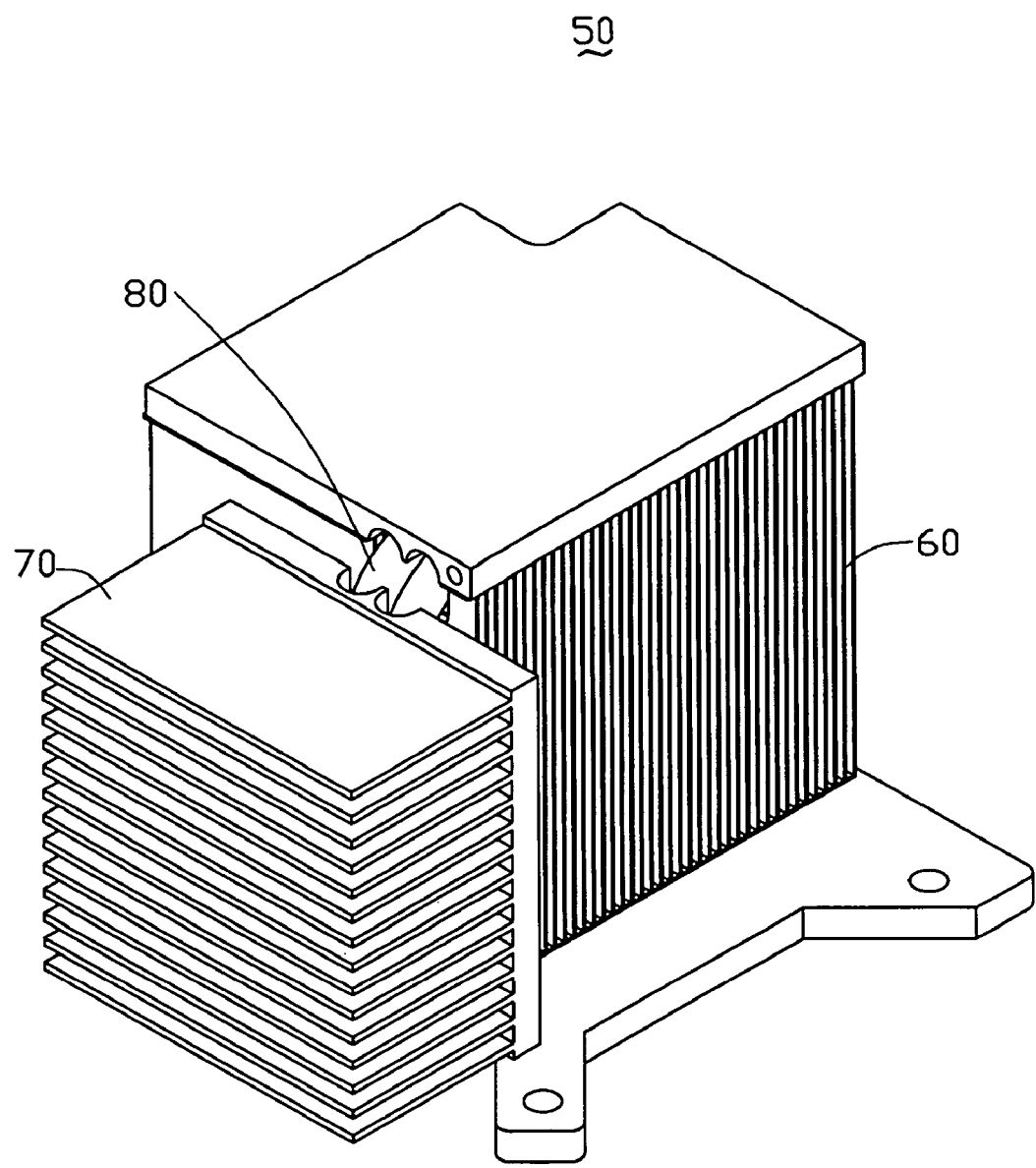
FIG. 1 is an assembled, isometric view of a heat dissipating device in accordance with a preferred embodiment of the present invention.
Figure 2:
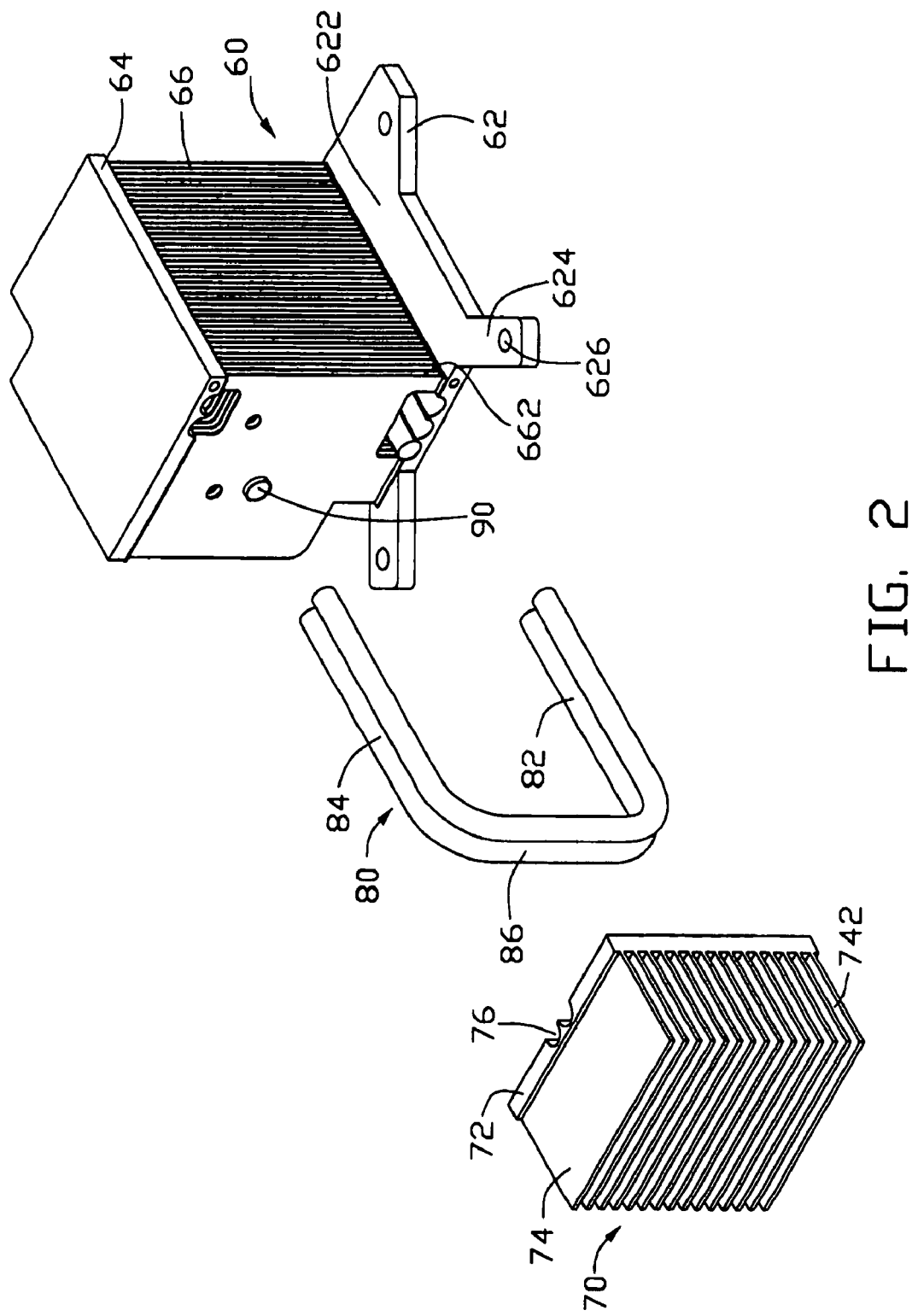
FIG. 2 is a partially exploded view of FIG. 1.
Figure 3:
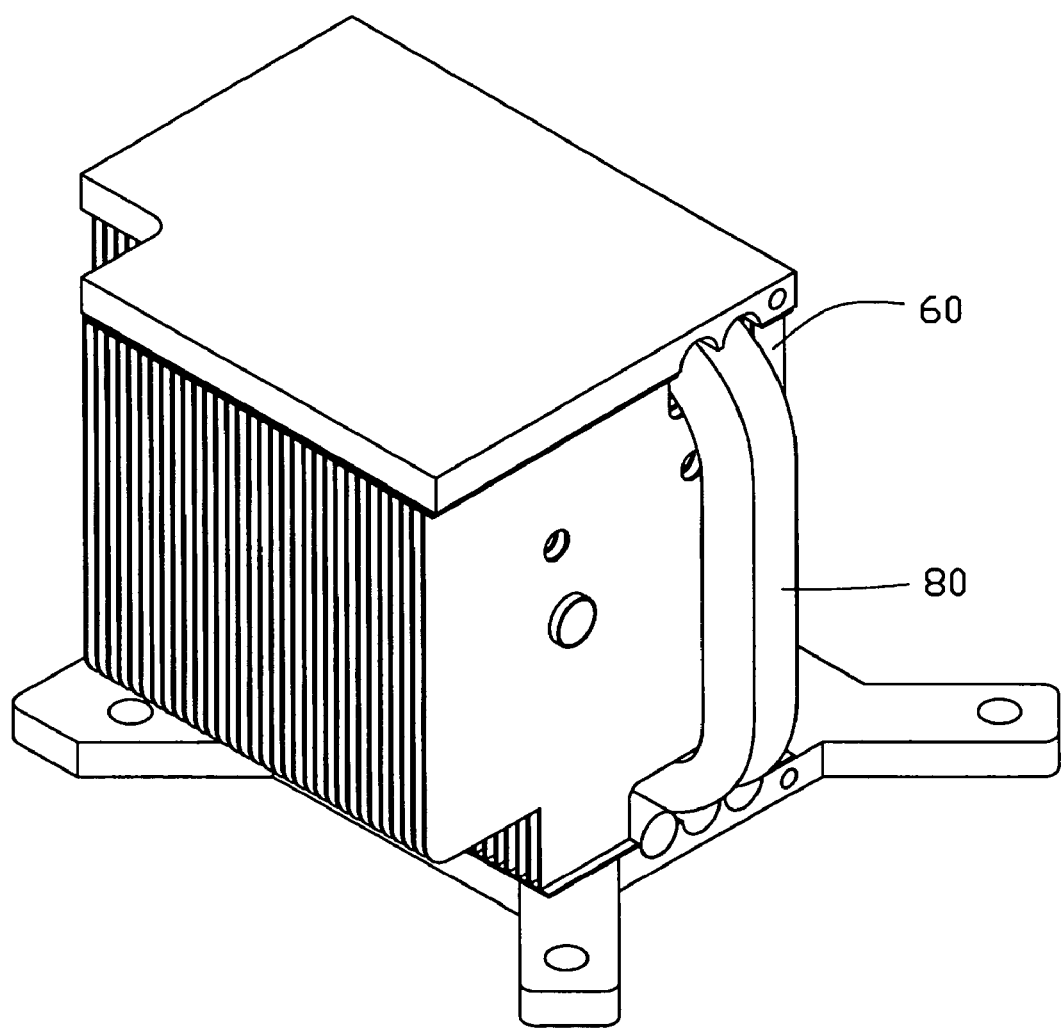
FIG. 3 is similar to FIG. 2, but having a heat sink of the dissipating device taken away.

Referring to FIGS. 1-3, a heat dissipating device 50 of the preferred embodiment of the invention comprises heat sink 60, a radiator 70 and heat-transfer pipes 80.

The heat sink 60 comprises a chassis 62 for gaining heat from a heat source, a plate 64 parallel to the chassis 62, and a plurality of fins 66 as one kind of a heat dissipating member. The fins 66 perpendicularly extend between and are thermally engaged with the chassis 62 and the plate 64 respectively. The fins 66 are parallel to each other and arranged in uniform intervals. An un-finned portion 622 of the chassis 62 is reserved to support a fan (not shown) on the chassis 62 and beside the fins 66 to thereby enforce air convection between the fins 66. Four ears 624 extend outwardly from the chassis 62. Each ear 624 defines a hole 626 therein for securing the heat dissipating device 50.

The radiator 70 is formed by extrusion. The radiator 70 comprises a base 72 and a plurality of metal flakes 74 integrally formed from the base 72 as another kind of the heat dissipating member. The base 72 of the radiator 70 is parallel to the fins 66 of the heat sink 60. The metal flakes 74 are parallel to each other and arranged in uniform intervals. Grooves 76 are defined in the base 72, opposite to the metal flakes 74 and facing the fins 66 of the heat sink 60.

Each heat-transfer pipe 80 is substantially U-shaped, and comprises a heat-absorbing portion 82, a heat-releasing portion 84, and a heat-transfer portion 86 to transfer heat absorbed by the heat-absorbing portion 82 to the heat-releasing portion 84. The heat-absorbing portion 82 is thermally positioned to the chassis 62, for absorbing heat from the chassis 62. The heat-releasing portion 84 is thermally positioned to the plate 64, for releasing heat to the plate 64. The heat-transfer portion 86 is positioned in the grooves 76 of the radiator 70, for releasing part of heat absorbed by the heat-absorbing portion 82 to the radiator 70.

The heat dissipating device 50 further comprises a heat-conveyance pipe 90. The heat-conveyance pipe 90 has an end thereof thermally engaged with the chassis 62 and an opposite end thereof thermally extended through the fins 66, so that the heat-conveyance pipe 90 conveys heat accumulated on the chassis 62 to the fins 66.

In the preferred embodiment of the invention, the heat-transfer pipes 80 and the heat-conveyance pipe 90 are heat pipes. The heat-absorbing portions 82 are engaged in slots (not labeled) defined in the chassis 62, and the heat-releasing portions 84 are engaged in slots (not labeled) defined in the plate 64.

In use of the heat dissipating device 50 of the present invention, the chassis 62 removes heat from a heat source, such as an electronic component (not shown), where the chassis 62 is attached to. The fins 66 absorb heat accumulated on the chassis 62 and then dissipate the heat to ambient air. The heat-absorbing portions 82 of the heat-transfer pipes 80 absorb heat accumulated on the chassis 62 and then deliveries the heat to the heat-releasing portions 84 through the heat-transfer portions 86. The heat on the heat-releasing portions 84 is subsequently transferred to the plate 64 and the fins 66 for being dissipated. Part of the heat passing the heat-transfer portions 86 is transferred to the base 72 of the radiator 70 to be dissipated by the metal flakes 74. The heat-conveyance pipe 90 absorbs heat accumulated on the chassis 62 and then releases the heat to the fins 66 to be dissipated.

In the present invention, there are three paths to remove heat accumulated on the chassis 62. It is highly effective to remove heat from the chassis 62 so that the heat on the heat source can be removed quickly. Part of heat passing through the heat-transfer portions 86, is absorbed by the base 72, and is then dissipated by the metal flakes 74, before it reaches the heat-releasing portions 84 of the heat-transfer pipes 80.

In the preferred embodiment of the present invention, the fins 66 define channels 662 therebetween for air convection extending from a side where the un-finned portions 622 of the chassis 62 to an opposite side of the heat dissipating device 50. The metal flakes 74 also define channels 742 for air convection, parallel to the channels 662 between the fins 66. Thus, when a fan is mounted on the un-finned portion 622 of the chassis 62, air convection in both of the heat sink 60 and the radiator 70 can be enforced.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A heat dissipating device comprising:
   a heat sink comprising a chassis, a plate separate from the chassis and a plurality of fins extending between the chassis and the plate;
   a radiator comprising a base parallel to the fins; and
   heat-transfer pipes each comprising a heat-absorbing portion thermally positioned to the chassis, a heat-releasing portion thermally positioned to the plate and a heat-transfer portion disposed between the heat-absorbing portion and the heat-releasing portion, the heat-transfer portion thermally received in the base of the radiator;
   wherein the radiator comprises a plurality of metal flakes integrally formed from the base, for dissipating heat to ambient air;
   wherein the fins of the heat sink define channels therebetween for air convection, the metal flakes of the radiator define channels for air convection which are parallel to the channels between the fins; and
   wherein the base of the radiator defines grooves therein, the grooves extend from one end of the base to another end of the base, and the heat-transfer portions are received in the grooves.

2. The heat dissipating device of claim 1, wherein the chassis comprises an un-finned portion for supporting a fan thereon.

3. The heat dissipating device of claim 1, wherein the plate is parallel to the chassis, the base is perpendicular to the chassis.

4. The heat dissipating device of claim 1, wherein the chassis comprises ears in which holes are defined, for securing the heat dissipating device.

5. A heat dissipating device comprising:
   a chassis;
   a plate parallel to the chassis;
   a base perpendicular to the chassis and the plate;
   a heat-transfer pipe, thermally engaged with the chassis, the base and the plate and transferring heat from the chassis to the base and further to the plate;
   a plurality of fins disposed in a space surrounded by the chassis, the plate and the base, and thermally engaged with two of the chassis, the plate and the base; and
   a plurality of metal flakes disposed outside said space surrounded by the chassis, the plate and the base, and extending from one of the chassis, the plate and the base;
wherein the heat-transfer pipe comprises a heat-absorbing portion thermally positioned to the chassis, a heat-releasing portion thermally positioned to the plate and a heat-transfer portion disposed between the heat-absorbing portion and the heat-releasing portion; and
wherein the fins and the metal flakes are located at opposite sides of the heat-transfer portion of the heat-transfer pipe.

6. The heat dissipating device of claim 5, wherein the metal flakes are integrally formed from said one of the chassis, the plate and the base.

7. The heat dissipating device of claim 5, wherein the base is parallel to the fins, and wherein the fins are extended between the chassis and the plate.

8. The heat dissipating device of claim 5, wherein one of the chassis, the plate and the base forms ears for securing the heat dissipating device.

9. The heat dissipating device of claim 5, further comprising a heat-conveyance pipe which is extended through the fins and is thermally engaged with one of the chassis, the plate and the base.

10. The heat dissipating device of claim 9, wherein the heat-conveyance pipe has an end thereof engaged with the chassis and another end thereof extending through the fins of the heat sink, the another end of the heat-conveyance pipe spaced from the plate.

11. The heat dissipating device of claim 5, wherein the heat-transfer pipe is U-shaped.

12. The heat dissipating device of claim 5, wherein the heat-transfer portion of the heat-transfer pipe is located between the fins and the metal flakes.

13. The heat dissipating device of claim 12, wherein the metal flakes are formed from the base and the heat-transfer portion is thermally received in the base to form a thermal path extending from the heat-transfer portion to the metal flakes, the thermal path extending through no more than the base.

14. The heat dissipating device of claim 5, wherein the heat-transfer pipe half surrounds the fins.

15. The heat dissipating device of claim 5, wherein the base is parallel to the fins, and wherein the fins are extended from the chassis to the plate.

16. A heat dissipating device comprising:
    a chassis used to thermally contact with a heat source and gain heat therefrom;
    at least two bases spaced from said chassis respectively;
    a plurality of heat dissipating members thermally contactable with said chassis and said at least two bases respectively; and
    at least one heat-transfer pipe comprising a portion thermally contactable with one of said heat source and said chassis to gain said heat therefrom, and another portions thermally contactable with said at least two bases respectively so as to transmit said heat to said plurality of heat dissipating members by means of said at least two bases respectively;
    wherein one of the at least two bases is positioned in the heat dissipating members; and
    wherein some of the heat dissipating members and the another portions of the at least one heat-transfer pipe are mounted at opposite sides of the one of the at least two bases positioned in the heat dissipating members.

17. The heat dissipating device of claim 16, wherein one of said at least two bases is a plate disposed away from said chassis and parallel thereto, and another of said at least two bases is disposed perpendicular to said chassis.

18. The heat dissipating device of claim 16, wherein a portion of said plurality of heat dissipating members is a plurality of fins disposed perpendicular to said chassis, and another portion of said plurality of heat dissipating members is a plurality of metal flakes extending along a direction perpendicular to each of said plurality of fins.

* * * * *